United States Patent
Ruby et al.

(10) Patent No.: US 7,193,901 B2
(45) Date of Patent: Mar. 20, 2007

(54) MONITORING THE THRESHOLD VOLTAGE OF FREQUENTLY READ CELLS

(75) Inventors: Paul Ruby, Folsom, CA (US); Sean Eilert, Penryn, CA (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 11/104,824

(22) Filed: Apr. 13, 2005

(65) Prior Publication Data

US 2006/0233020 A1 Oct. 19, 2006

(51) Int. Cl.
*G11C 11/34* (2006.01)

(52) U.S. Cl. .............................. 365/185.33; 365/185.09

(58) Field of Classification Search ........... 365/185.33, 365/185.09
See application file for complete search history.

(56) References Cited

U.S. PATENT DOCUMENTS

| | | | |
|---|---|---|---|
| 6,826,103 B2* | 11/2004 | Moon et al. ................. | 365/210 |
| 6,853,598 B2* | 2/2005 | Chevallier ................... | 365/201 |
| 2002/0149081 A1* | 10/2002 | Goda et al. .................. | 257/510 |
| 2004/0257888 A1* | 12/2004 | Noguchi et al. ............. | 365/200 |
| 2005/0094440 A1* | 5/2005 | Tu et al. .................. | 365/185.17 |
| 2005/0117396 A1* | 6/2005 | Hotaka ................... | 365/185.21 |

OTHER PUBLICATIONS

U.S. Appl. No. 10/999,598, filed Nov. 30, 2004, Christian A. Camarce et al.., *Analog Counter Using Memory Cell* (ITL.1196US).

* cited by examiner

*Primary Examiner*—Michael Tran
(74) *Attorney, Agent, or Firm*—Trop, Pruner & Hu, P.C.

(57) ABSTRACT

A canary cell may be used in a semiconductor memory to indicate an incipient failure. For example, the canary cell may be provided on rows in a flash memory. Before a read disturb occurs, the canary cell may first sense the condition, for example, because it may be biased with a higher drain bias and is, therefore, more susceptible to the read disturb problem.

25 Claims, 3 Drawing Sheets

MONITORING THE THRESHOLD VOLTAGE OF FREQUENTLY READ CELLS

BACKGROUND

This invention relates generally to semiconductor memories.

Flash memories may be read a number of times. Each time the flash memory is read, its threshold voltage increases. After a number of read cycles, the threshold voltage may eventually become so high that a read failure occurs. Such a failure is called a read disturb.

In a read disturb, the cell fails to read and there is no practical way to access the stored information. As a result, the memory may be considered unreliable and the memory is essentially worthless even though the read disturb may be confined to one or only a few number of cells. In other words, the bulk of the memory array may be fully operable, but a failure in a small percentage of the cells may make the entire integrated circuit of no further value. The read disturb problem may be particularly severe when an isolated region of the array is read many more times than other regions.

Thus, there is a need for ways to monitor the threshold voltages of semiconductor memory cells.

DETAILED DESCRIPTION

Figure 1:
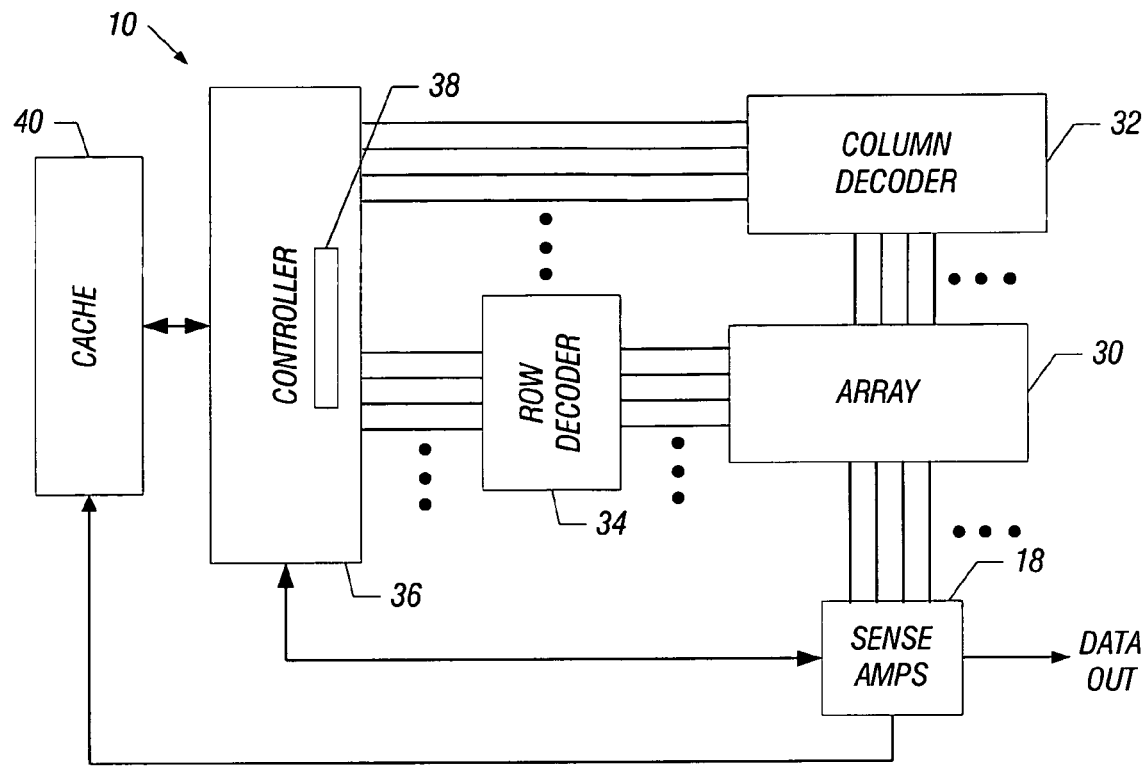
FIG. 1 is a schematic depiction of a flash memory in accordance with one embodiment of the present invention.

Referring to FIG. 1, an array 30 may include rows and columns of flash memory cells in one embodiment. While the terms rows and columns are used herein, other terms may be used as well, including word lines and bit lines. The array 30 may be arranged in rows or word lines and may be addressed by a row decoder. Likewise, the cells in the array 30 may be arranged in columns or bit lines and may be addressed by a column decoder 32. The accessing of the array 30 for read, write, and erase may be controlled by a controller 36. The controller 36 may communicate with a set of sense amplifiers 18 that are coupled to the bit lines of the array 30.

For example, in a read cycle, the row decoder 34 may access a row within the array 30 and the column decoder 32 may successively access a plurality of bit lines or column lines within that array 30. In some embodiments, the sense amplifiers 18 may receive signals from a selected cell in a selected bit line and a reference signal and may compare those signals to determine the sensed state of the cell. Of course, other sensing schemes may be utilized as well.

When a read disturb occurs, a read failure may occur because the threshold voltage of the cell has gotten to high. On each successive read cycle the threshold voltage of a cell that is read increases ever so slightly. Over a large number of cycles the cell may no longer be accessible because its threshold voltage is too high. The read disturb may be a function of the number of times that any given cell or group of cells on a given word line or row have been accessed. Each time the word line is accessed, the threshold voltage of the cells on that word line may be increased.

Before a read disturb occurs in the array 30, the heightened possibility of a read disturb condition may be sensed, in some embodiments of the present invention, and the data in the affected area, generally one word line or row, is transferred to the cache 40. Thereafter, the cache 40 is accessed in place of the row that has one or more cells that are considered to be under increased suspicion of experiencing a read disturb. In fact, however, the row is not yet defective but a prediction has been made that the row may soon be subject to a read disturb. Therefore, to avoid the adverse consequences of the read disturb, the data may be transferred out of the row and into the cache 40 and thereafter accessed from the cache 40. This preventive caching operation avoids the situation where data is no longer accessible.

Figure 2:
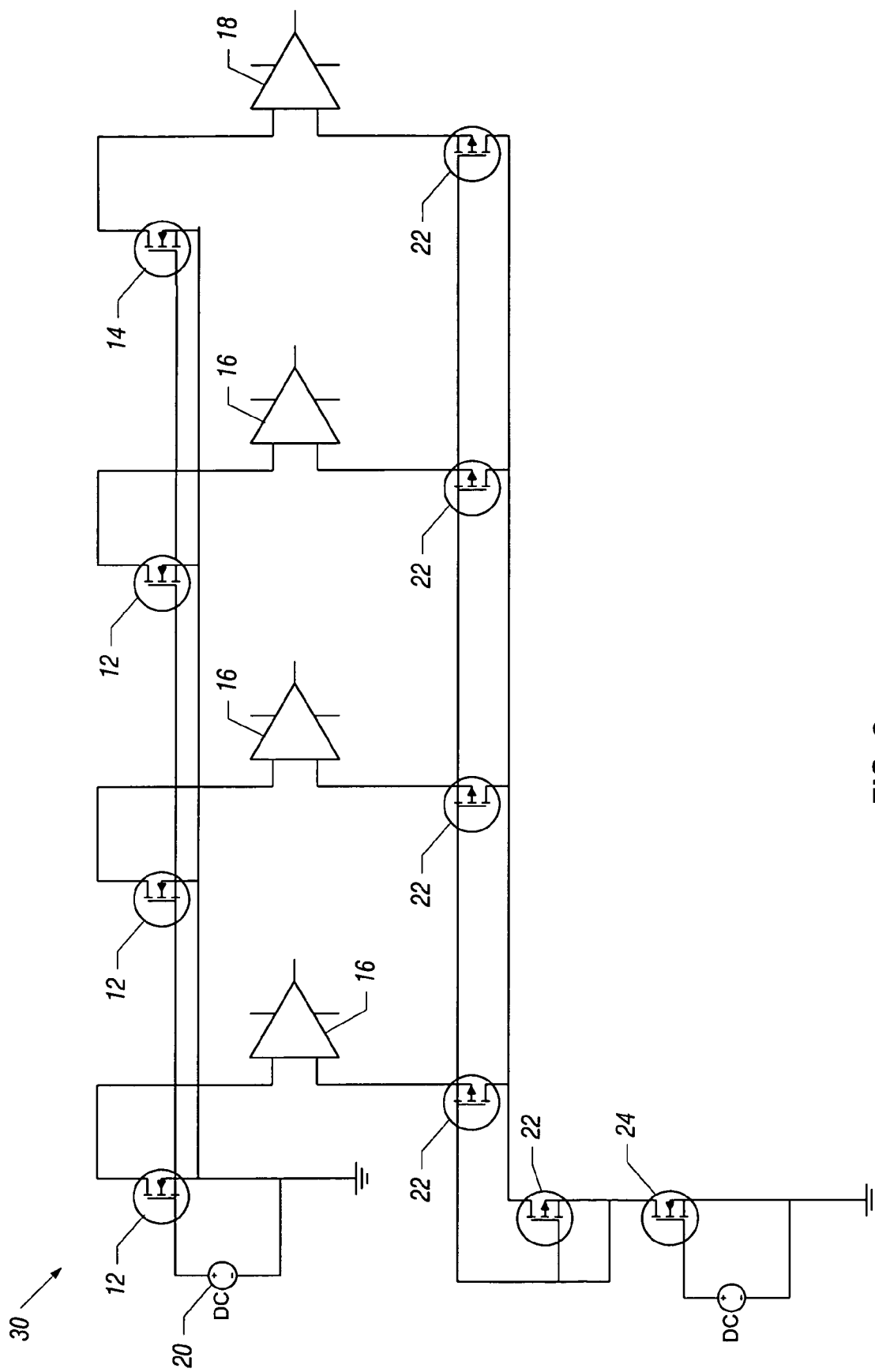
FIG. 2 is a schematic depiction of an array layout in accordance with one embodiment of the present invention.

Turning to FIG. 2, the array 30 may include an array of flash cells, including the cells 12, which may be part of one word line. The cells 12 receive a DC potential 20 from a direct current (DC) voltage source in one embodiment of the present invention. The drain of each cell 12 is coupled to a sense amplifier 16 associated with the bit line for that cell. The sense amplifier 16 has one input coupled to the drain of a plurality of cells in a given column and another input coupled through a current mirror 22 to a reference cell 24. The reference cell also receives a DC potential 20.

The reference cell 24 generates a reference voltage which is mirrored by the current mirrors 22 to the sense amplifier 16. Based on a comparison to the reference cell 24 voltage, a determination is made as to whether the given, addressed cell is programmed or not.

In addition to the conventional cells 12 on each row, a detector or a canary cell 14 may be provided that has a higher drain bias than the other cells 12 receive. For example, the cells 12 may be biased by a drain bias circuit at a voltage less than 1 volt to reduce read disturbs. The canary cell 14 may be drain biased, for example, at a voltage over one volt to induce an earlier read disturb. As a result of its higher drain bias, the canary cell 14 experiences read disturbs sooner than the other cells 12 on the row. A higher drain bias may be supplied by the sense amplifier 18. The sense amplifier 18 will be the first to report a data error due to read disturb. This error signal is then used to trigger the cache 40 operation so that all of the data on the row, with the canary cell 14 that has reported a data failure, is immediately stored into the cache 40. This enables the reading of the data before the read disturb occurs in the actual memory array 30. Thereafter, the given row is accessed from the cache 40 instead of the array 30.

Figure 3:
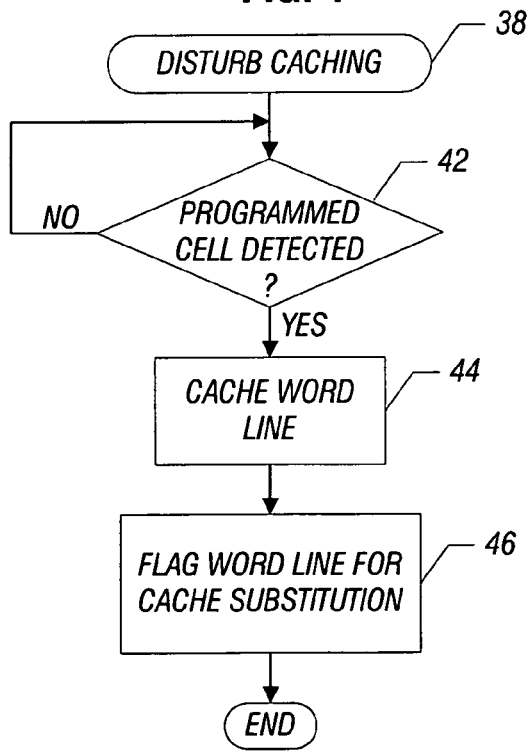
FIG. 3 is a flow chart for software according to one embodiment of the present invention.

Referring to FIG. 3, the disturb caching software 38 may be stored in the controller 36 in one embodiment of the present invention. However, the caching protocol may be implemented in microcode or in hardware in other embodiments. When the sense amplifier 18 associated with the canary cell 14, detects a programmed cell, as determined in diamond 42, it sends a signal to the controller 36. The controller 36 caches the word line associated with that canary cell as indicated in block 44. Then, the word line is flagged, as indicated in block 46, so that further accesses to that word line will be implemented through the cache 40.

In some embodiments of the present invention, the sensitivity to a read disturb may also be increased by providing a separate reference cell for the sense amplifier 18 associated with the canary cell 14. For example, that separate reference may be a lower threshold voltage reference cell (lower compared to the reference cells associated with the conventional flash cells 12).

Caching is used to replace word lines in flash memories in other contexts. For example, when a memory region is repeatedly read, it may be cached to increase the speed of data access. A similar operation may be done here, but for a different purpose.

While the illustrated embodiment involves a flash memory, some embodiments of the present invention may apply to other memories that are susceptible to data corruption from long term use or stress. For example, dynamic random access memories, which require periodic refresh, could use canary cells of the type described herein to alter the priority or period of refresh for sections of the array to save power and improve reliability.

Figure 4:
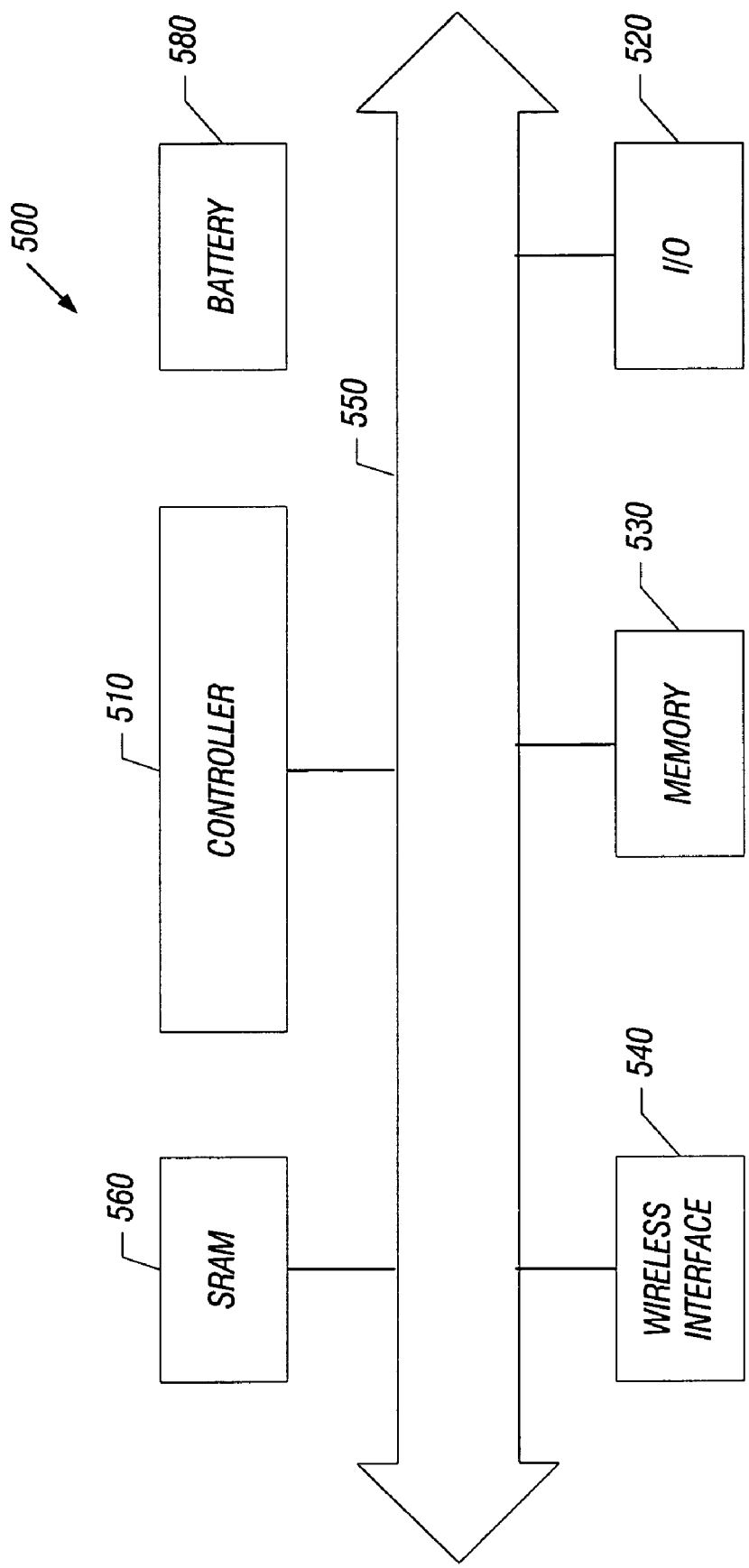
FIG. 4 is a system depiction for one embodiment of the present invention.

Referring to FIG. 4, a system 500, in accordance with one embodiment of the present invention, may be any processor-based system that uses a semiconductor memory susceptible to failure over long term operation such as a flash memory as described in the illustrated embodiment. The system 500 may be a mobile device including a battery 580 in some embodiments. Examples of processor-based systems 500 include laptop computers, desktop computers, servers, cameras, movie cameras, personal digital assistants, games, Internet appliances, set top boxes, and cellular telephones, to mention a few examples.

The system 500 may be a controller 510 which, in one embodiment, may be a microprocessor and in other embodiments may be a microcontroller, a group of microprocessors, or a digital signal processor. The controller 510 may be coupled by a bus to a static random access memory (SRAM) 560, a wireless interface 540, a memory 530, which may be the flash memory 10 in one embodiment of the present invention, and an input/output device 520. The wireless interface may enable radio frequency communications such as cellular telephone or networked communications. The wireless interface 540 may include a dipole antenna. The input/output device 520 may be any conventional input/output device including, for example, a display, a keyboard, a mouse, and a touch screen, to mention a few examples.

The memory 530 may facilitate radio frequency communications in a wireless embodiment. For example, the memory 530 may store messages to be sent or received. However, the present invention is in no way limited to any particular architecture and, certainly, is not limited to processor-based systems that enable wireless communications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a cell which gives an indication of a potential adverse situation before the situation actually affects data storing cells in a memory array by providing the cell with a higher drain bias so it experiences a read disturb before other cells on the same row.

2. The method of claim 1 including providing a cell, on each row in a memory array, said cell giving an early indication of a potential adverse situation.

3. The method of claim 1 wherein providing a cell includes providing a cell that gives an early warning of a read disturb.

4. The method of claim 1 wherein providing a cell includes providing a flash memory cell on a row of flash memory cells.

5. The method of claim 1 including providing a higher drain bias to said cell from a sense amplifier coupled to said cell.

6. The method of claim 1 including automatically storing data in a cache memory for subsequent access when said cell indicates a potential adverse situation.

7. The method of claim 1 including providing said cell on a row of flash memory cells and accessing a cache instead of said row in response to said cell indicating a potential adverse situation.

8. The method of claim 1 including providing a cell which provides an early indication of an excessive threshold voltage increase in a memory cell.

9. The method of claim 8 including automatically accessing a cache memory in place of a row in a semiconductor memory when said cell indicates an adverse situation.

10. A semiconductor memory comprising:
    an array of memory cells to store data;
    a detector cell coupled to said memory cells to indicate when the memory cells may become subject to an adverse condition in the future; and
    a cache memory and a controller, said controller to automatically access said cache in response to the detection by said detector cell of said adverse condition.

11. The memory of claim 10 wherein said memory is a flash memory.

12. The memory of claim 10 including a word line, said memory cells arranged on said word line, said detector cell coupled to said word line.

13. The memory of claim 10 wherein said detector cell receives a different bias than said memory cells.

14. The memory of claim 13 including sense amplifiers, each of said memory cells coupled to a different sense amplifier.

15. The memory of claim 14 wherein said detector cell receives a higher drain bias than said memory cells.

16. The memory of claim 10 wherein said detector cell provides an indication of when the memory cells may become subject to a read disturb.

17. The memory of claim 10 wherein said detector cell is on a word line of said memory, said word line including said memory cells, said cache to store the data previously stored on said word line in response to the detection of said adverse condition.

18. The memory of claim 17 wherein said cache line to store data in place of said memory cells after said adverse condition is detected.

19. The memory of claim 10 wherein said detector cell to detect an increased threshold voltage.

20. An article comprising a medium storing instructions that, if executed, enable a processor-based system to:
    prevent a read disturb by caching data stored in a memory upon detecting the possibility of a read disturb; and
    flag a word line to prevent the word line from being accessed and to access instead data stored in a cache.

21. The article of claim 20 further storing instructions that, if executed, enable the processor-based system to detect whether a memory cell, exposed to a drain bias higher than the drain bias of other cells in said memory, is programmed.

22. A system comprising:
   a controller;
   a semiconductor memory including a canary cell to detect a read disturb, a word line, a plurality of memory cells on said word line, and said canary cell on said word line; and
   a static random access memory coupled to said controller.

23. The system of claim 22 wherein said semiconductor memory is a flash memory.

24. The system of claim 22 wherein said canary cell is biased differently than said memory cells so that it experiences a read disturb before said memory cells.

25. The system of claim 24 including a cache memory in said semiconductor memory, said cache memory to replace said word line when said canary cell detects a read disturb.

* * * * *

UNITED STATES PATENT AND TRADEMARK OFFICE
CERTIFICATE OF CORRECTION

| | | |
|---|---|---|
| PATENT NO. | : 7,193,901 B2 | Page 1 of 1 |
| APPLICATION NO. | : 11/104824 | |
| DATED | : March 20, 2007 | |
| INVENTOR(S) | : Paul Ruby and Sean Eilert | |

It is certified that error appears in the above-identified patent and that said Letters Patent is hereby corrected as shown below:

Column 3:
Line 62, "cell" should be --memory cell--;
Line 65, "cell" should be --memory cell--;

Column 4:
Line 36, "claim 10" should be --claim 12--.

Signed and Sealed this

Fourteenth Day of August, 2007

JON W. DUDAS
*Director of the United States Patent and Trademark Office*